(12) United States Patent
Hodko et al.

(10) Patent No.: US 6,322,684 B1
(45) Date of Patent: Nov. 27, 2001

(54) APPARATUS AND METHOD FOR ELECTROPLATING OR ELECTROETCHING A SUBSTRATE

(75) Inventors: Dalibor Hodko, College Station; Jeffrey Dillon, Bryan; Waheguru Pal Singh, College Station; Oliver J. Murphy, Bryan, all of TX (US)

(73) Assignee: Lynntech, INC, College Station, TX (US)

( * ) Notice: Subject to any disclaimer, the term of this patent is extended or adjusted under 35 U.S.C. 154(b) by 0 days.

(21) Appl. No.: 09/390,830

(22) Filed: Sep. 7, 1999

(51) Int. Cl.[7] ..................................................... C25D 5/02
(52) U.S. Cl. ............................................. 205/125; 205/128
(58) Field of Search ................................... 205/128, 129, 205/137, 136, 157

(56) References Cited

U.S. PATENT DOCUMENTS

| | | | |
|---|---|---|---|
| 3,847,786 | 11/1974 | Landauer | 204/300 |
| 5,476,578 * | 12/1995 | Forand et al. | 204/207 |
| 5,543,028 * | 8/1996 | Herbert et al. | 205/70 |
| 5,804,052 * | 9/1998 | Schneider | 205/96 |
| 6,176,995 * | 1/2001 | Schneider | 205/125 |

\* cited by examiner

*Primary Examiner*—Kathryn Gorgos
*Assistant Examiner*—Erica Smith-Hicks
(74) *Attorney, Agent, or Firm*—Streets & Steele; Jeffrey L. Streets

(57) ABSTRACT

An apparatus is disclosed having at least one cathode adapted to maintain a line of contact with at least one substrate surface during relative movement therebetween. There is at least one anode located in a spaced relationship to the cathode and an electronically insulating member located between the at least one anode and the at least one cathode adapted to provide a gap between the substrate surface and the insulating member. When placed in a plating bath, the electric field is directed toward conducting patterns on a substrate to uniformly plate the patterns while minimizing plating on the electrode. The same device may also be used for electroetching by reversing the polarity of the electrodes.

5 Claims, 4 Drawing Sheets

APPARATUS AND METHOD FOR ELECTROPLATING OR ELECTROETCHING A SUBSTRATE

This invention was made with Government support under grant DMI-9761331 awarded by the National Science Foundation (NSF). The Government has certain rights in this invention.

FIELD OF THE INVENTION

The present invention relates to an apparatus and method for electroplating and/or electroetching a substrate.

BACKGROUND OF THE INVENTION

There are several applications where conductive patterns on a substrate are subsequently plated with a metal or etched to remove a metal. Many of these conductive patterns are discontinuous, making subsequent plating difficult. Examples of such processes can be found in the printed wiring board manufacturing industry, plastic foil etching processes, or other processes where re-plating or additional electroplating of the existing discontinuous conducting patterns is desired. Discontinuous conducting patterns are used herein to describe patterns that are not electrically connected.

Current direct metallization processes use electroless plating processes to deposit a metal on conducting patterns formed on the surface of a substrate. In these methods, conductive patterns are formed lithographically using stabilized colloidal graphite, colloidal palladium, or conducting polymer films as a conducting material. When the conducting patterns are electroplated, the process is slow and the deposited metal spreads out slowly from a point of electrical contact made with the patterns. Due to this slow electroplating process it is very important to achieve a uniform electric field distribution in the electroplating bath to obtain metal deposits of uniform thickness.

Therefore, there is a need for an apparatus and a method for electroplating and/or electroetching metal layers on one or more conductive patterns formed on a substrate, that provides uniform plating and/or electroetching of the desired metal and minimizes plating of the metal on the contact cathode surface.

SUMMARY OF THE INVENTION

One embodiment of the present invention provides an apparatus comprising: at least one cathode adapted to maintain a line of contact with at least one substrate surface during relative movement therebetween; at least one anode located in a spaced relationship to the cathode; and an electronically insulating member located between the at least one anode and the at least one cathode adapted to provide a gap between the substrate surface and the insulating member. Preferably, the cathode is selected from a cylinder, a cone, a brush or a belt. A cylindrical cathode may have a longitudinal axis and be adapted to rotate about the longitudinal axis.

Another embodiment of the invention provides a method for electroplating discontinuous conducting elements on a substrate, comprising: disposing an electroplating solution over a substrate surface having discontinuous conducting elements formed thereon; providing a line of contact between a cathode and one or more of the discontinuous conducting elements; disposing an anode in the electroplating solution adjacent the line of contact; disposing an electronically insulating member between the anode and cathode; and moving the line of contact over the substrate surface to contact a plurality of the discontinuous conducting elements.

BRIEF DESCRIPTION OF THE DRAWINGS

So that the above recited features and advantages of the present invention can be understood in detail, a more particular description of the invention, briefly summarized above, may be had by reference to the embodiments thereof which are illustrated in the appended drawings. It is to be noted, however, that the appended drawings illustrate only typical embodiments of this invention and are therefore not to be considered limiting of its scope, for the invention may admit to other equally effective embodiments.

DETAILED DESCRIPTION OF THE INVENTION

Figure 1:
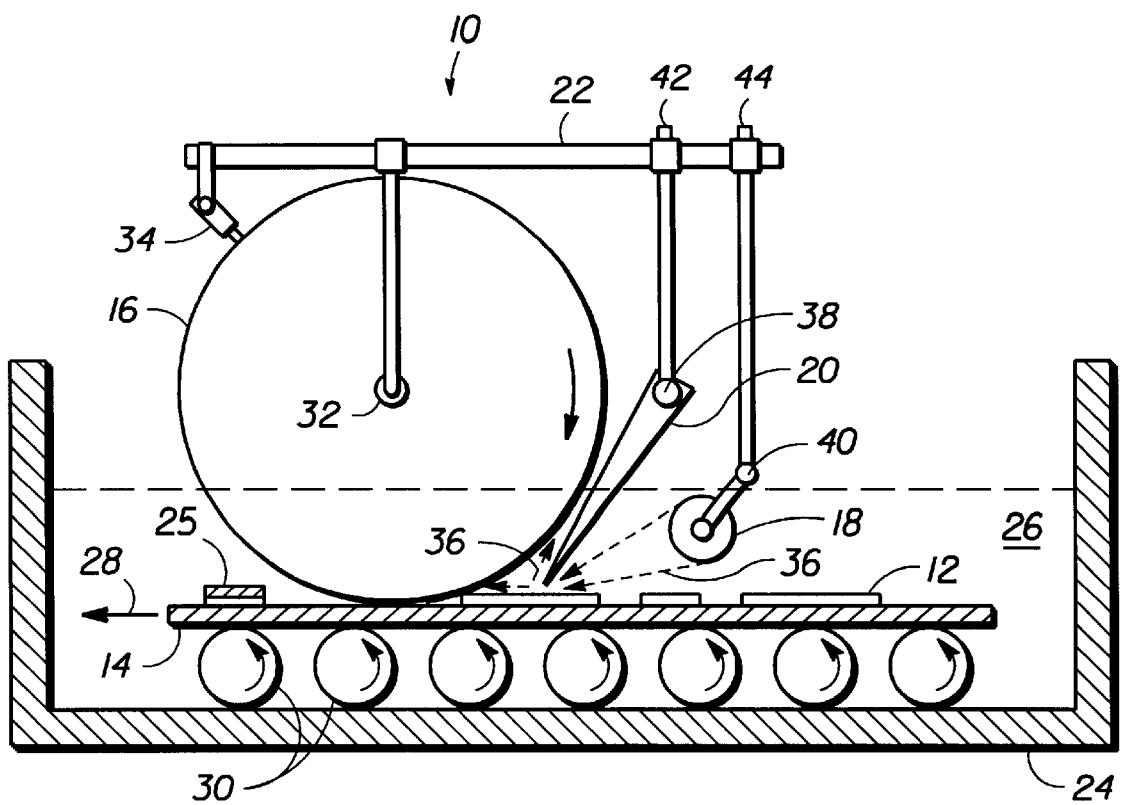
FIG. 1 is a schematic view of one embodiment of the present invention.

The present invention relates to an apparatus and method for electroplating or electroetching conductive elements on a substrate or directly on a substrate having low electrical conductivity. The apparatus and method can be used in electroplating and/or electroetching processes such as printed wiring board processes.

One aspect of the present invention provides a rolling cathode and an anode separated by an insulating member. The cathode is positionable in contact with the conductive elements or substrate to be plated. The cathode is directly connected to the negative lead of an electrical power supply by a brush contact or similar means that transfers electricity to the moving cathode. In the case of electroetching, the poles would be reversed and the anode would be contacting the substrate. The rolling cathode accommodates relative movement between the cathode and substrate while maintaining electrical contact. The relative movement may be accomplished in a plating bath either by moving the substrate across a stationary (although rolling) cathode, or moving (while rolling) the cathode over a stationary substrate, or some combination of the two movements.

With regard to electroplating, the electric field flowing from the anode is channeled or partially blocked by an electrically insulating member so that the electric field is directed toward the substrate and not the cathode. Directing the electric field towards the substrate in the region between the anode and the cathode facilitates the deposition of the desired metal on to the substrate. The distance from the electrically insulating member and/or the anode to the surface to be electroplated may be adjusted in order to achieve a uniform electric field adjacent the surface to be electroplated and ultimately uniform deposition of a metal layer on the surface. The distances between the electrically insulating member, the anode, and the cathode may also be adjusted to focus the electric field on the substrate.

The insulating member typically extends the length of the cathode in the axial direction and it may surround a portion of the circumference of the cathode that is not in contact with the substrate. The portion of the circumference surrounded may be a small or large portion, depending on the particular application. For example, if the electrolyte is highly conductive, the electric field around the cathode would need to be controlled or focused toward the substrate surface to achieve uniform plating on the substrate.

The cathode of the present invention may be made from a rigid material, such as metal, or a pliable material that essentially conforms to the substrate surface. The cathode is positioned in intimate contact with the substrate surface, thus restricting the amount of electrolyte between the cathode and the contacting surface and encouraging plating on the conducting surface(s) immediately adjacent to the cathode. For example, intimate contact with the discontinuous conducting elements on the substrate surface allows for uniform plating of the desired metal on those regions of the elements contacted, despite the elements having electrical conductivity that is too low to allow electroplating of the entire element from a single electrical contact. The electrically insulating member directs the cations flowing from the anode toward the substrate to promote localized plating on the conducting elements while minimizing plating on the cathode itself.

The rolling cathodes of the present invention are suitable for electroplating systems that plate one side or both sides of a substrate. In the latter case, rolling cathodes are provided on both sides of the substrate and in intimate contact with the opposing substrate surfaces to form a plating zone or small trough that is large enough to hold liquid electrolyte and submerge the anode. As the cathodes move across the substrate surface (or the substrate moves through the cathodes), portions of the patterned substrate enter the plating zone and are plated with the desired metal. The liquid electrolyte in the plating zone can be re-circulated by providing a supply inlet and a pump for removing electrolyte from the plating zone. The recirculation of the electrolyte may include batch or continuous replacement/adjustment of the electroplating solution and the recirculation may be controlled to provide a constant level of the solution in the plating zone.

The rolling cathode of the present invention may be used to uniformly plate thin conductive substrates having thin films or thin conducting patterns. Examples of thin films include thin metallic films obtained by evaporation, sputtering or direct metallization processes. Other thin films include: conducting polymer films or colloidal metal and films obtained using conductive inks. Thin metallic films that are 0.1 to a few microns thick typically exhibit low conductivity and are thus difficult to plate evenly because the plating spreads and tends to be thicker at the point of electrical contact.

In another aspect of the present invention, there is provided a method for electroplating conducting patterns on a substrate.

FIG. 1 is a schematic view of an apparatus 10 that can be used for electroplating or electroetching conducting patterns 12 on a substrate 14. A generally cylindrical cathode 16, an anode 18 and an insulating member 20 are shown mounted on a support member 22. It should be noted that the cathode (anode in the case of electroetching) can be any shape or form so long as contact is made with the conducting patterns in a uniform manner. The apparatus 10 is placed adjacent to the substrate 14 in a plating bath 24, filled with an electrolyte 26. The insulating member 20 is used to direct the electric field, indicated by dashed lines 36, as the electric field 36 extends from the anode 18, toward the substrate 14.

The distance between the substrate 14 and the insulating member 20 can be adjusted upward or downward depending on the desired application. The insulating member 20 preferably extends the length of the cathode 16, to prevent the direct deposition of metal onto the cathode 16 and promote deposition of a metal layer 25 onto the conducting patterns 12. In addition, the anode 18 may be adjusted upward or downward to achieve the desired plating efficiency. The substrate 14 can be moved in the direction indicated by arrow 28 by a series of rollers 30. The cathode 16 rotates about its longitudinal axis 32 while contact with the power source is maintained through a brush contact or other contacting means 34. The negative pole of a power supply (not shown) is connected to the cathode 16 and the positive pole of the power supply to the anode 18 to provide the plating current (during electro-etching, the polarities are reversed and the rolling cathode becomes a rolling anode).

During plating the position of the insulating member 20 can be adjusted so that the throwing power between the anode 18 and cathode 16 is directed toward the conducting patterns 12 on the substrate 14. The anode 18 is stationary and is positioned close to the insulating member 20 and cathode 16 to provide an adequate electric field for plating. The position of the insulating member 20 can be adjusted pivotally by a screw mechanism or other adjustment means 38 and horizontally by sliding the anode along the support arm. The anode may be adjusted by a screw mechanism or other adjusting means 40. Other means of mounting and adjusting the relative position between the insulating member and electrodes can be used and are considered to be known in the art.

The anode 18 and insulating member 20 can be adjusted horizontally by using sliding mechanisms 42, 44. The sliding mechanisms 42, 44 provide for movement along the support member 22. The level of the plating solution 26 in the bath is preferably kept as low as possible to minimize electroplating on the cathode 16. The cathode 16 can be made of any material which provides good conductivity for contacting the conductive patterns and it preferably has a high overpotential for metal plating and exhibits poor adhesion of plated metallic layers. Suitable cathode materials include but are not limited to stainless steel, aluminum, anodized aluminum, its alloys and oxides, titanium and its alloys and oxides, niobium, tantalum, hafnium, noble metal oxide-coated titanium, tantalum, hafnium, or niobium, titanium diboride, titanium nitride, zirconium nitride, as well as graphite materials, including glassy and vitreous carbon.

When the device is used for electroetching and the anode is moving over the substrate, the anode should be made of a material that is stable against corrosion or sometimes called a dimensionally stable anode. Suitable anode materials include but are not limited to, platinum, iridium oxide/ruthenium oxide-coated titanium, tantalum, hafnium, or niobium, and noble metal-coated titanium, tantalum, hafnium, or niobium, such as platinum, rhodium, iridium or their oxides.

Figure 2:
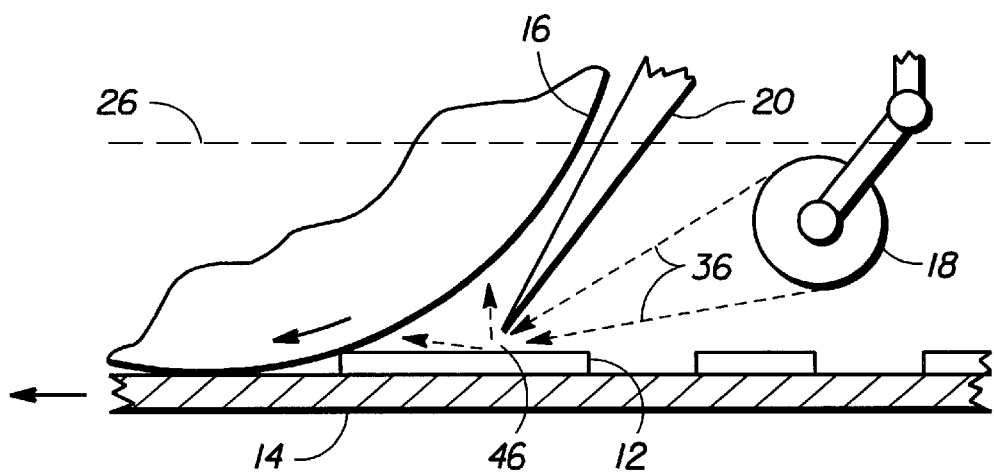
FIG. 2 is an enlarged view of the electrode portion of FIG. 1.

FIG. 2 is an enlarged view of the cathode 16, insulating member 20, substrate 14 interface shown in FIG. 1, showing the distribution of the electric field lines 36. The insulating member forms a small gap 46 or passage between the conducting pattern 12 on the substrate 14 and the insulating member 20 such that the electric field lines are forced to pass through the gap 46 in order to reach the cathode 16. The electric field lines are thus focused or directed toward the conducting pattern 12. This encourages a majority of the plating current to yield a metal coating on the conducting pattern 12.

Figure 3:
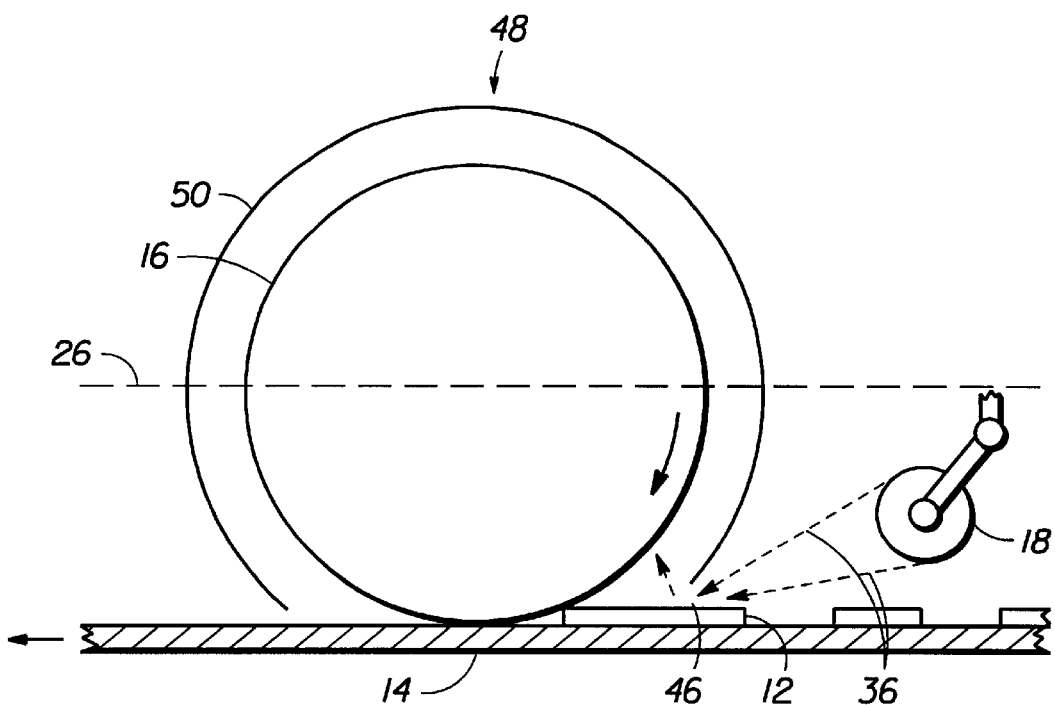
FIG. 3 is a schematic view of an alternative insulating member for use in the present invention.

FIG. 3 is a schematic representation of another embodiment of the present invention, similar to the apparatus shown in FIG. 2, where like parts bear the same reference numbers. The apparatus 48 has a cathode 16 with an insulating member 50 surrounding most of the circumference of the cathode 16 excluding the portion of the cathode that is in contact with the substrate 14. The insulating member 50 effectively directs the electric field lines 36 from the anode 18 toward the conducting pattern 12, while minimizing the field lines that contact the cathode 16 which in turn reduces the amount of metal plated on the cathode 16.

Figure 4:
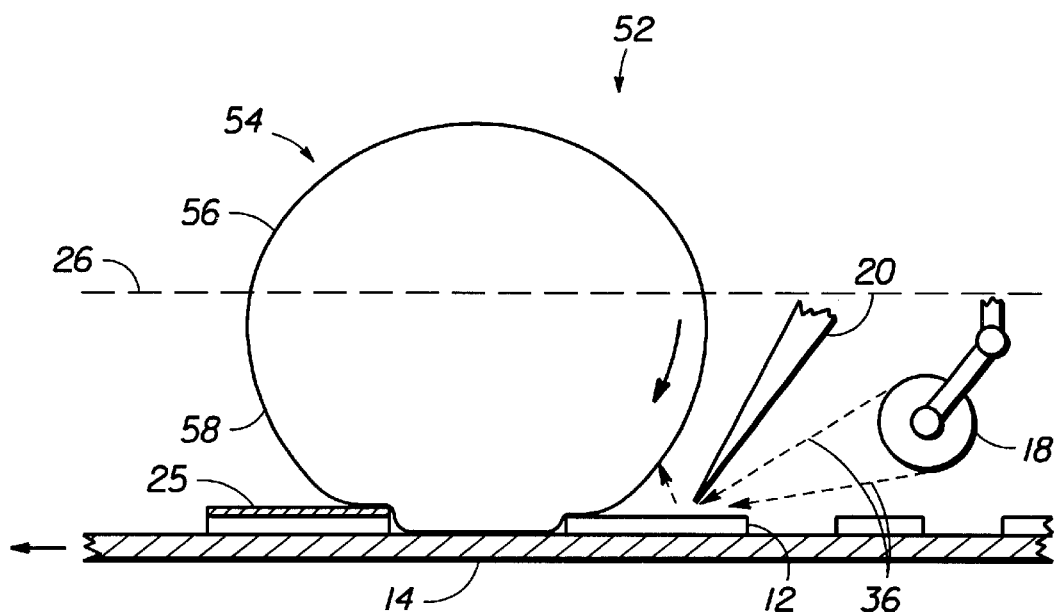
FIG. 4 is a schematic view of a second embodiment of the present invention.

FIG. 4 is a schematic representation of yet another embodiment of the invention, similar to the one shown in FIG. 2, where like parts bear the same reference numbers. The apparatus 52 utilizes a soft or pliable cathode 54 in order to achieve better contact with the conducting pattern 12. The cathode 54 can have a core 56 made from pliable materials, such as synthetic rubber, polysilicone rubber, polyurethane, polyvinyl chloride, or polysiloxane. Also, a flexible outer sheath made of a pliable material can be used by sliding the sheath over a rigid material. A metallic coating 58, with low adhesion for and a high overpotential for metal plating is preferably deposited on the surface of the core 56 to provide electrical contact with the conducting pattern 12. Examples of suitable metallic coating materials include titanium, tantalum, hafnium, niobium, tungsten, stainless steel, aluminum, and their oxides, anodized aluminum, anodized titanium, graphite and vitreous carbon and conducting polymer materials.

It is understood that the embodiments shown in FIGS. 1–4, can be adapted for use in a system that provides double-sided plating by positioning electrodes on either side of a substrate and providing a means for moving the electrodes and/or the substrate through the plating bath.

Figure 5:
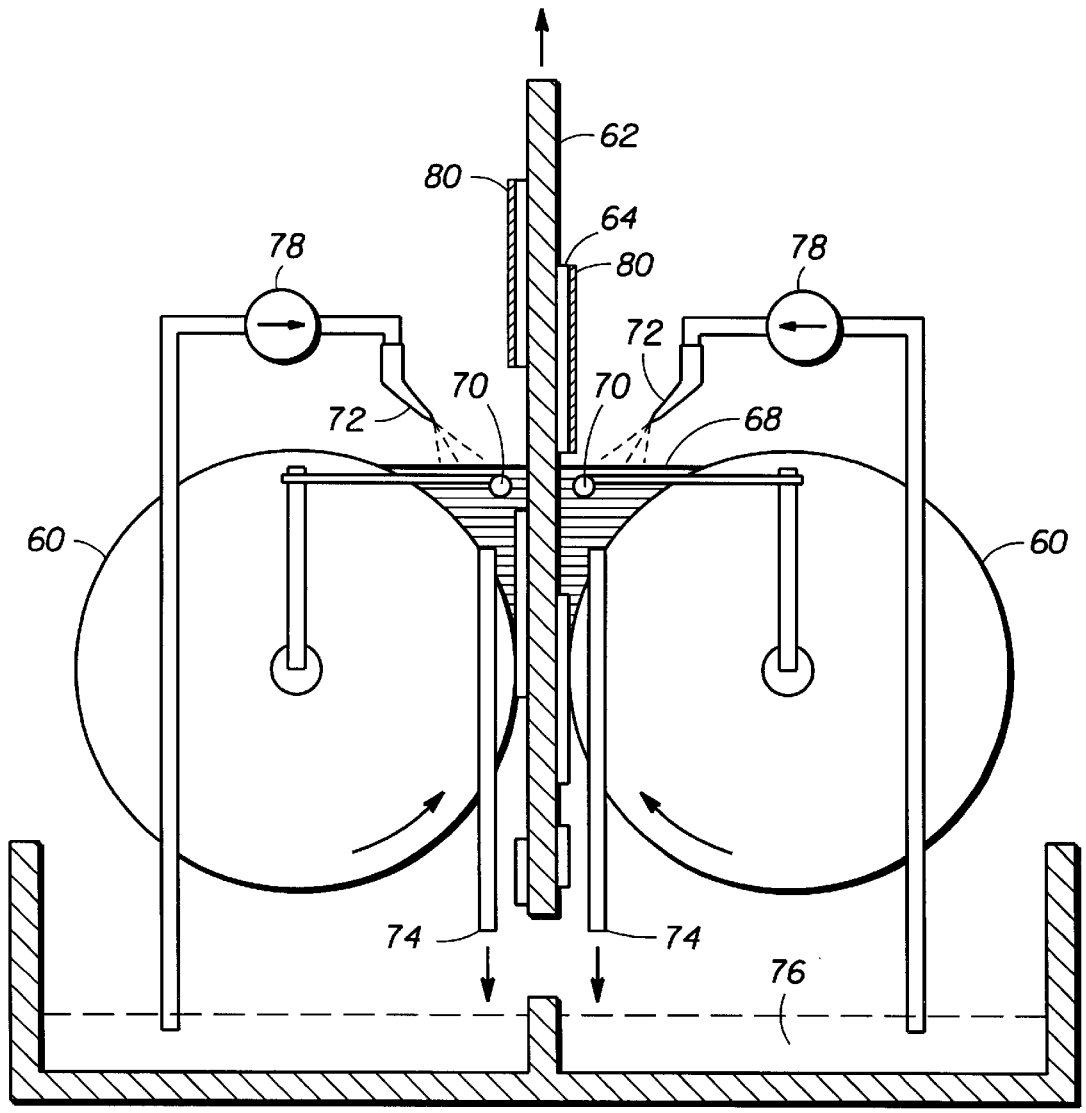
FIG. 5 is a schematic view of a third embodiment of the present invention.

FIG. 5 is a schematic drawing of another embodiment of the present invention where the volume of the plating solution is minimized. This is achieved by providing a cathode and anode combination like the one shown in FIG. 1. However, the cathode 60 is in close contact with the substrate 62 having conducting patterns 64 to be plated such that a trough 66 for holding the electrolyte solution 68 is formed between the substrate 62 and the cathode 60. The trough 66 is preferably filled with just enough electrolyte 68 to submerge the anode 70. The electrolyte 68 can be re-circulated while maintaining the electrolyte level by providing a fluid supply inlet 72 and outlet 74 that recycle the electrolyte from a plating bath 76. A pump 78 may be provided to facilitate the recirculation. Insulating members (not shown) similar to the one shown in FIG. 1 may be used if desired to focus the electric field lines toward the conducting pattern 64, which is ultimately plated with a metal layer 80. The embodiment shown here includes two cathode/anode combinations for a double-sided plating operation, however it should be noted that the device would also work with a single cathode and anode for plating one side of a substrate.

Figure 6:
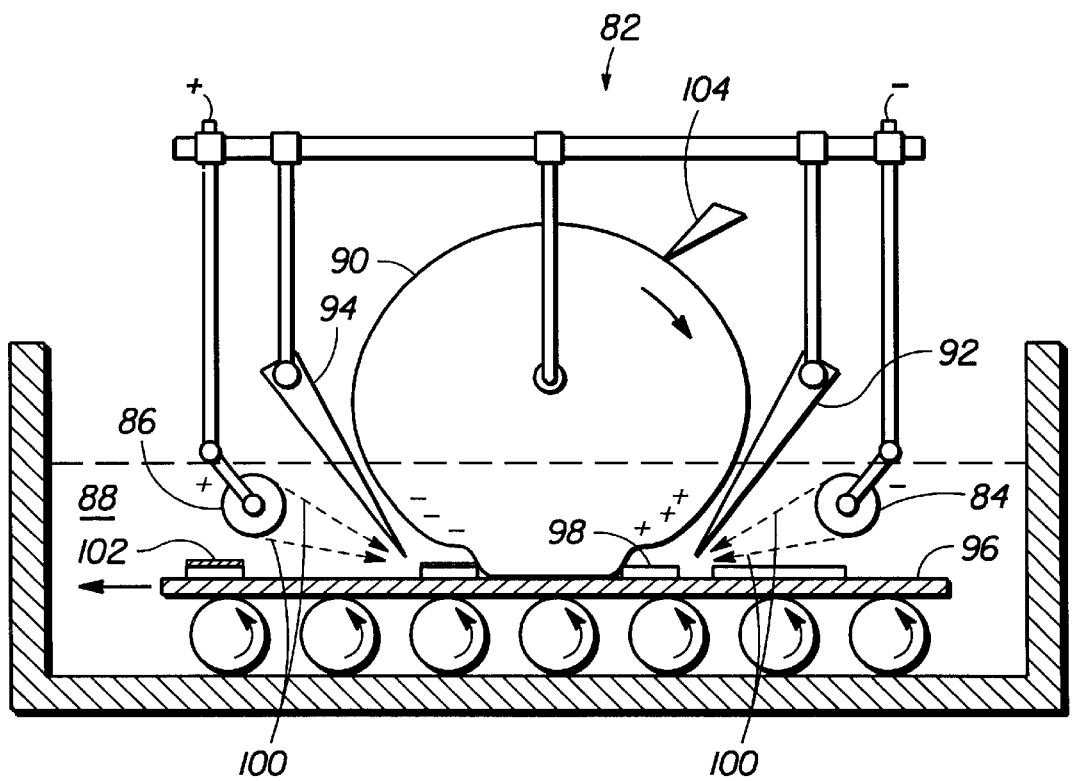
FIG. 6 is a schematic view of a fourth embodiment of the present invention.

FIG. 6 is a schematic representation of another embodiment of the present invention. The apparatus 82 has a cathode 84 and an anode 86 suspended in an electrolyte solution 88 with a pliable bipolar electrode 90 disposed therebetween. The electric field is applied to the anode 86 and cathode 84 which are positioned adjacent to a substrate surface 96 having conducting patterns 98 formed thereon. The bipolar electrode 90 is similar to the cathode described in FIG. 5, and is designed to maintain contact with the substrate surface 96. There are two insulating members 92, 94 positioned between each electrode and the bipolar electrode 90 which act to focus the electric field lines 100 toward the conducting patterns 98. When an electric field is applied between the cathode 84 and the anode 86, the surface of the bipolar electrode 90 becomes positively charged on the cathode side and negatively charged on the anode side. The positive charge on the cathode side acts to slightly etch the surface of the conducting pattern 98, while the negative charge on the anode side promotes the plating of a metal layer 102 on the conducting pattern 98. It is important to note that the bipolar electrode maintains close contact with the substrate surface, effectively restricting any flow of electrolyte therebetween. If the bipolar electrode 90 rotates within the bath, a scraper 104 is provided to remove the electrolyte from the outer surface of the bipolar electrode as it moves out of the electrolyte to maintain the charge separation between the positively and negatively charged portions of the bipolar electrode.

EXAMPLE 1

Construction of the Cathode Electroplating Device

The cathode device used in the following examples consisted of a support member, made from a sheet of ⅜" polyvinylchloride, holding a cathode, an anode and an insulating member. The cathode was a polished half inch diameter aluminum rod. The anode consisted of a twenty six gauge platinum wire attached to the support member at a fixed distance from the cathode. The insulating member consisted of a retractable, thin polyvinylchloride shield. With the insulating member in place between the anode and cathode, a direct path to the cathode was obstructed forcing an increased number of metal ions to pass near the conducting patterns on the substrate, producing rapid, more efficient plating on the conducting patterns.

EXAMPLE 2

Determination of Optimum Rolling Cathode Material

A series of tests were performed to determine the best material for the rolling cathode. Desirable properties of the rolling cathode material are: 1) slow rate of metal electroplating on the surface of the rolling cathode; and 2) low adherence of any electroplated metal on the surface of the rolling cathode thereby enhancing the efficiency of the coating of the conducting patterns. This could be achieved by choosing a rolling cathode surface having high overpotential for metal plating. Electroplating tests were performed by electroplating nickel from an electroplating bath over copper patterns prepared on fiber glass/epoxy composite (FR-4) substrates. Commercial printed wiring board substrate material, FR-4, 30 mil in thickness (available from Beaver Brook Company, Bethel, Conn.) was used in the tests. The nickel deposits provided a contrast on the surface of the copper patterns laid down on the surface of the FR-4 substrate and could be inspected visually and/or by optical microscope.

The copper electroplating solution consisted of: copper sulfate, 75 g/l (Aldrich Chemical Co.), sulfuric acid 100 ml/l (98%, Aldrich), Copper Graham 2001 Additive, 5 ml/l, Copper Graham 2001 Leveller, 2.5 ml/l, Copper Graham 2001 Carrier, 2.5 ml/l, all from LeoRonal, Inc., Freeport, N.Y.

LECTRO-NIC 10-03S (Enthone-Omi, of Bridgeview, Ill.) nickel sulfamate based electroplating solution (nickel sulfamate 340 g/l, nickel 75 g/l, boric acid, 40 g/l) was used to electroplate nickel on the copper-plated patterns. The subsequently plated nickel deposits were well suited as an undercoat for precious or other nonprecious metal deposits used in printed circuits, connectors, and semiconductor devices.

Copper patterns were also produced on copper-laminated FR-4 boards using a laser toner transfer and etching system. A board was cut to size (2"×2", 2"×6" or 3"×3") and blasted with extremely fine glass beads to roughen the copper surface and remove any surface oxides from the copper. Acetone and denatured alcohol were then used to clean the board. The printed wiring board pattern layout was designed on a computer using a simple drawing program (Canvas 5.0). Once the design was finalized, the circuit pattern was printed on transfer paper using a laser printer. The laser toner print is loosely held to the paper allowing for easy transfer to copper using heat from a transfer applicator. The transfer applicator pulls the board and transfer paper across heater plates while lightly pressing the two together. The toner melts and bonds the paper to the copper. Placing the board in water for a few minutes causes the paper to lift from the board leaving the circuit layout, defined by the toner, on the copper. Imperfections were corrected using an etch resistant pen. The board was then submerged in an ammonium persulfate solution where the exposed copper was etched away leaving only the intended circuit. The laser toner was then stripped using acetone revealing a shiny copper circuit. After cleaning with denatured alcohol, the board was ready for nickel electroplating tests with the rolling cathode apparatus.

Rolling cathode materials tested included glassy carbon, titanium and aluminum. The current used was set to 40 mA giving a cathode current density of 10 mA/cm$^2$ at an electrode spacing between the cathode and anode of approximately 1.75 inches. The conducting pattern for electroplating was a 0.05"×1" copper trace. Glassy carbon produced very low adhesion for electroplated nickel but was prone to thick layer plating, while titanium demonstrated a much slower nickel plating rate yet had strong adhesive properties for electroplated nickel. The aluminum cathode displayed slow, uniform electrodeposition of nickel while maintaining only a slight adhesion of the electrodeposited nickel. A slow metal electrodeposition rate allows for longer effective electrolyte solution life. The cathode is also easier to clean and requires less frequent cleaning due to the weak adhesion properties of aluminum for electroplated nickel. The tests also revealed that electroplating was more uniform in areas where the cathode surface had a smooth finish. The materials tested here do not exclude other potential candidate materials for the cathode such as tantalum, niobium, and hafnium, stainless steel, titanium oxides or suboxides, anodized aluminum, various types of carbon material such as vitreous carbon, graphite, ruthenium oxide/iridium oxide-coated titanium, tantalum, niobium, and hafnium, titanium diboride, titanium nitride, and zirconium nitride.

EXAMPLE 3
Comparison of Stationary vs. Moving Cathode Electroplating Process

A moving cathode allows for cathodic contact to be made to each conducting pattern on a printed circuit board, regardless of shape, number or length of the patterns. Copper patterns consisting of three-seven inch parallel patterns having widths of 0.015", 0.030" and 0.050" were used to test the differences between a moving and stationary cathode. In the experiment with the stationary cathode, the cathode was held stationary and perpendicular to the patterns, contacting all three patterns simultaneously at one end of the board. A constant current of 80 mA was applied for three minutes. In the test with the moving cathode, the cathode was moved several times over the board containing the copper patterns. The applied current and plating duration were kept the same as in the stationary electrode test. The effectiveness of the moving cathode system was determined by comparing the nickel plating thickness at three different points along the length of the patterns. The results revealed that the plating thickness near the contact point in the stationary test was much higher than at other points along the plated patterns. This was apparent from a dendritic growth of thicker nickel deposits near the contact points. The moving cathode generated uniform plating over the entire length of the patterns. These tests were repeated three times and yielded similar results.

Several parameters including applied current density, elapsed plating time and relative speed of the cathode over the substrate were investigated to determine the best design for the plating process. It was found that the process time could be shortened to three minutes without compromising coating quality by increasing the applied current density and making three consecutive passes with the moving cathode over the substrate.

It is important to note that when a moving cathode is used, the anode is preferably maintained at a fixed distance from the cathode. This is easily accomplished by mounting the anode on the support member adjacent to the cathode.

EXAMPLE 4
Electroplating with Motorized Rolling Cathode System

A motorized pulling system was built that had a geared 12V/DC motor equipped with a variable speed control. A twenty-four gauge insulated wire was connected to the support member in order to pull the printed circuit board through the plating solution and under the cathode. The electrode support member was fixed in place while the board was pulled under the cathode, insulating member and anode. The pulling system was tested using a 3.5 inch square FR-4 board with parallel conducting patterns on the surface of the board. Good results were obtained when the board was pulled at a rate of one inch per minute on applying a current of 300 mA, then turning the board 180° and repeating the electroplating process. All the patterns were electroplated simultaneously and it was found that the electrodeposited nickel was uniform throughout the board and of good quality.

EXAMPLE 5
Electroplating of Conducting Polymer Patterns

Conducting polymer patterns were formed on a FR-4 board by applying the following formulation to the surface of the board: (i) a molar ratio of pyrrole monomer/silver nitrate of 8:1; (ii) aniline concentration in the range 14–16 mole % with respect to pyrrole; (iii) acetonitrile to pyrrole monomer volume ratio 1:1; and (iv) two (volume) percent water with respect to acetonitrile. The formulation was then masked with a stainless steel mask made from shim stock and illuminated with a lamp emitting light in the range of 240–320 nm for about 30 minutes. The polymerized portions of the polymer were then dipped in a 0.03 M PdBr$_2$ solution for about 10 minutes.

Electroplating of photopolymerized conducting polymer patterns was then tested using the rolling cathode electroplating device. Because the conductivity of the conducting polymer patterns is much lower than that of thin film copper patterns, the effect of the rolling cathode on the electroplating process is even more noticeable. Thus, with a stationary cathode it was clearly visible that electroplating of nickel started first near the contact point where the largest amount of metal was plated. The electroplating process slowly proceeded along the patterns. By using the moving cathode, a plating layer of higher uniformity in thickness was achieved and accumulation of plated metal around the contact point, as with the stationary cathode, was avoided. These results demonstrated that the moving cathode electroplating device could be used for electroplating conducting patterns in a direct metallization process such as those based on conducting polymer patterns, collidal graphite-based patterns or colloidal palladium-based patterns. These materials regularly show lower than desired electrical conductivity which means they cannot be directly electroplated without first being plated using an electroless copper process. The moving cathode device provides a method for directly electroplating a desired metal onto highly conductive or poorly conducting patterns on the surface of a substrate. The moving cathode device avoids the need for an electroless copper step and yields uniformly plated conducting patterns.

It will be understood that certain combinations and subcombinations of the invention are of utility and may be employed without reference to other features in subcombinations. This is contemplated by and is within the scope of the present invention. Because many possible embodiments may be made of this invention without departing from the spirit and scope thereof, it is to be understood that all matters hereinabove set forth or shown in the accompanying drawings are to be interpreted as illustrative and not in a limiting sense.

We claim:

1. A method for electroplating discontinuous conducting elements on a substrate, comprising:
    (a) disposing an electroplating solution over a substrate surface having discontinuous conducting elements formed thereon;
    (b) providing a line of contact between a cathode and one or more of the discontinuous conducting elements;
    (c) disposing an anode in the electroplating solution adjacent the line of contact;
    (d) disposing an electronically insulating member between the anode and cathode; and
    (e) moving the line of contact over the substrate surface to contact a plurality of the discontinuous conducting elements.

2. The method of claim 1, wherein the step of moving the line of contact includes rolling the cathode over the substrate surface.

3. The method of claim 1, further comprising directing an electric field between the anode and cathode along the substrate surface.

4. The method of claim 1, further comprising preventing the electroplating solution from contacting the entire cathode.

5. The method of claim 1, further comprising maintaining continuous contact between the cathode and the substrate surface until all of the discontinuous conducting elements on the substrate surface have been contacted.

* * * * *